United States Patent
Hoxey

(10) Patent No.: US 8,067,971 B2
(45) Date of Patent: Nov. 29, 2011

(54) PROVIDING ADDITIONAL INPUTS TO A LATCH CIRCUIT

(75) Inventor: Paul Darren Hoxey, Great Shelford (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/585,622

(22) Filed: Sep. 18, 2009

(65) Prior Publication Data

US 2011/0068842 A1    Mar. 24, 2011

(51) Int. Cl.
*H03K 3/356* (2006.01)
(52) U.S. Cl. .......................... 327/211; 327/199; 327/230
(58) Field of Classification Search .................. 327/199, 327/207, 208, 210–214, 218, 230
See application file for complete search history.

(56) References Cited

U.S. PATENT DOCUMENTS

| | | | |
|---|---|---|---|
| 5,557,225 A * | 9/1996 | Denham et al. | 327/199 |
| 6,501,315 B1 * | 12/2002 | Nguyen | 327/217 |
| 7,180,348 B2 * | 2/2007 | Frederick et al. | 327/199 |
| 7,315,191 B2 * | 1/2008 | Branch et al. | 327/203 |
| 7,414,449 B2 * | 8/2008 | Russell et al. | 327/218 |
| 7,649,393 B2 * | 1/2010 | Maeda | 327/198 |

* cited by examiner

*Primary Examiner* — Hai L Nguyen
(74) *Attorney, Agent, or Firm* — Nixon & Vanderhye P.C.

(57) ABSTRACT

A latch circuit for retaining and transmitting an input data value is disclosed, along with a memory, and a method for retaining and transmitting data. The latch circuit includes a primary input for receiving a data value, an output for outputting the data value, a data transmission path including a transmitting device for transmitting the data value from the primary input to the output, a feedback loop for retaining the data value, the feedback loop including the transmitting device and a further device. The further device is configured to turn on in response to assertion of an activating signal and to turn off in response to no assertion of the activating signal. The feedback loop not retaining data when the further device is turned off, and the feedback loop further including a multiplexer, and the multiplexer is configured to connect either the data transmitting device to the further device and form the feedback loop or to connect a secondary input to the further device and form a secondary data transmission path from the secondary input through the further device and the transmitting device to the output.

19 Claims, 7 Drawing Sheets

PROVIDING ADDITIONAL INPUTS TO A LATCH CIRCUIT

BACKGROUND OF THE INVENTION

1. Field of the Invention

The field of the invention relates to latch circuits for transmitting and retaining data.

2. Description of the Prior Art

Latch circuits provide a way of receiving, retaining and transmitting data values. They have an input for receiving a value, a data transmission path for transmitting the value to an output, and a feedback loop for storing the value.

FIG. 1a shows a latch circuit according to the prior art. This latch circuit has an input inverter 12 followed by a transmission gate 10. The transmission gate 10 is either open or closed, allowing or blocking access of an inverted input data value to the feedback storage loop 20. Feedback storage loop 20 comprises an inverter 22, and a tristate inverter 24. The tristate inverter 24 and transmission gate 10 are clocked by the same clock, such that when the transmission gate 10 is open, the tristate inverter 24 is off, and the latch circuit simply transmits data from the input via inverter 22 to the output. Inverters 12 and 22 act to invert the input value twice so that the input value is output.

When the transmission gate 10 is not conducting, the input is isolated from the feedback loop. At this point tristate inverter 24 switches on and the feedback loop becomes operational and retains the previously input data value. Thus, this value is held at the output until the transmission gate 10 switches on again whereupon the feedback loop is switched off, the previous value is no longer retained and a value at the input is received at the latch.

Latches of this type are designed with regard to the performance of the forward data path. If an additional input is required for a latch, for example, if the latch is required to be able to process both functional data and scan data, then this additional input can be provided by providing a multiplexer at the input to the latch, the multiplexer being able to select between either the scan input or the data input. A drawback of this is that this multiplexer lies on the forward data path and thus, will affect the performance of the latch when it is in functional mode.

It would be desirable to produce a latch with additional inputs while providing little impact on performance of the latch in functional mode.

SUMMARY OF THE INVENTION

A first aspect of the present invention provides a latch circuit for retaining and transmitting an input data value, said latch circuit comprising: a primary input for receiving a data value; an output for outputting said data value; a data transmission path comprising a transmitting device for transmitting said data value from said primary input to said output; a feedback loop for retaining said data value, said feedback loop comprising said transmitting device and a further device, said further device being configured to turn on in response to assertion of an activating signal and to turn off in response to no assertion of said activating signal, said feedback loop not retaining data when said further device is turned off; said feedback loop further comprising a multiplexer, said multiplexer being configured to connect either said data transmitting device to said further device and form said feedback loop or to connect a secondary input to said further device and form a secondary data transmission path from said secondary input through said further device and said transmitting device to said output.

The present invention recognises that devices within the feedback loop that are not on the forward data path of a latch do not affect the performance of the latch in functional mode. It therefore addresses the problem of providing an additional input to the latch by providing a multiplexer within the feedback loop that is not on the forward data path. This multiplexer can select between connecting an additional input to the further device or connecting the transmitting device to the further device and thereby forming the feedback loop.

In this way in functional mode, the multiplexer is present in the feedback loop and therefore affects the performance of this loop, but it is not present in the forward data path and as such has no effect on that. The performance of the feedback loop is not important for the performance of the latch and as such a multiplexer arranged in this way can provide an additional input without unduly affecting the functional performance of the latch.

In secondary input mode, the secondary input is selected and data from this input can be transmitted via the further device, and the transmitting device to the output. This is not a fast transmission path as it includes the multiplexer and the further device, as well as the transmitting device. However, the possibility of having a secondary input is provided without affecting the performance of transmitting data from the primary input.

In some embodiments, said multiplexer comprises a select signal input and is configured to operate in functional mode and to connect said data transmitting device to said further device to form said feedback loop in response to select signal input at said select signal input having a first predetermined value and to connect said secondary input to said further device in response to said select signal having a second predetermined value.

The multiplexer is arranged in the feedback loop so that it can switch between connecting the feedback loop to provide retention of an input data value and a mode where the feedback loop is broken and a secondary input is connected via the further device and transmitting device to the output.

In some embodiments, said multiplexer is configured to operate in a secondary input mode in response to a secondary input enable signal said latch being configured to turn said further device on in said secondary input mode and said select signal being configured to switch between said first and said second predetermined values, such that in response to said second predetermined value, said secondary input is connected to said further device and a data value at said secondary input is input, and in response to said first predetermined value said further device is connected to said transmitting device to form said feedback loop and said input data value is retained.

Providing the secondary input allows the latch to operate in a secondary input mode. When this mode is enabled by the secondary input enable signal the further device is turned on constantly. Control of the feedback loop now depends on the multiplexer which switches between breaking the feedback loop by connecting the secondary input to the further device, and connecting the feedback loop. In this way, the multiplexer controls the transmission and the retention of data input by the secondary input.

Although the select signal that controls the multiplexer can be an asynchronous signal that switches between states, in some embodiments it is a clocked signal so that the data at the secondary input is input to the latch in a clocked fashion.

In some embodiments, said latch circuit further comprises an isolating device at said primary input said isolating device being configured to transmit data in response to no assertion of said activating signal and not to transmit data in response to assertion of said activating signal.

The latch circuit may have an isolating device at its primary input that can transmit data or isolate the input from the storage device. This isolating device is controlled by the same signal that controls the further device so that when the isolating device is open the input value passes from the input to the output via the transmitting device and when the isolating device is closed, then the value is retained by the feedback loop.

In some embodiments, said isolating device comprises one of a transmission gate and a tristate inverter.

The isolating device can comprise a number of things such as a transmission gate or a tristate inverter provided that it can either connect or isolate an input value from the feedback loop in response to an activating signal.

In some embodiments, said activating signal is a clock signal, said further device being configured to turn on in response to a first level of said clock signal and to turn off in response to a second level of said clock signal.

Although the activating signal can be an asynchronous control signal, in some embodiments it is a clock signal and the latch is part of a synchronous circuit.

In some embodiments, said latch circuit comprises a plurality of primary inputs, each of said plurality of primary inputs comprising a respective isolating device, each of said respective isolating devices receiving independent activating signals, said latch circuit being configured such that only one of said independent activating signals is not asserted at any one time.

A latch circuit may have a number of primary inputs provided that each of them are controlled independently so that only one is transparent and can input data to the latch at any one time. The independence of the inputs can be controlled in a number of ways. For example, the latch may be configured so that the activating signals can only have one activating signal not asserted at any one time. Alternatively, there may be a priority circuit present which provides the activating signals with priority and if more than one activating signal is not asserted at any one time the not asserted activating signal with the highest priority is transmitted to the isolating device that it controls and the others are blocked.

In some embodiments, said multiplexer is configured to connect said transmitting device to said further device to form said feedback loop or to connect one of a plurality of secondary inputs to said further device to form a secondary data transmission path from said one of said plurality of secondary inputs through said further device and said transmitting device to said output.

In addition to and/or alternatively to having multiple primary inputs there may also be multiple secondary inputs. These may be provided by a multiplexer that has a number of inputs, one of them being to form the feedback loop and the others being independent secondary inputs.

In some embodiments, said transmitting device is a higher performance device than said further device.

As noted previously, when designing latches, they are generally designed for an improved performance on the forward data path. Thus, in embodiments of the present invention the transmitting device is a higher performance device than the further device. This may be achieved by providing a transmitting device that is larger than the further device. In this way, a latch with a higher performance on the forward data path is provided without unduly increasing the overall size of the latch.

In some embodiments, said transmitting device comprises an inverter and said further device comprises a clocked tristate inverter.

The transmitting device and the further device can comprise a number of things provided that they can transmit data and one of them can be activated or not activated in response to an activated signal. Inverters and clocked tristate inverters are common devices for use in such feedback loops.

Although the latch can take a number of forms, in some embodiments it comprises a transparent set dominant latch circuit. Such a latch lends itself well to having a secondary input and can provide functions such as scan functions using the secondary input.

A second aspect of the present invention provides a memory comprising: a data storage array for storing data; data access circuitry for providing data access to said memory, said data access circuitry comprising a latch circuit according to a first aspect of the present invention, said latch circuit being arranged to receive data to be output from said memory at said primary input; and said memory comprising a scan input for inputting scan data, said latch circuit being arranged to receives said scan input at said secondary input.

The latch circuit of the first aspect of the present invention is particularly useful in a memory. Memories require a latch to latch data output from the storage array. They also often need to be provided with the ability to perform a scan function. When performing a scan, test data is clocked through a system being tested using a series of latches arranged to form a scan chain. The latch circuit of the first aspect of the present invention can be used both as a latch in a scan chain, and also as the output latch of the memory. When used as the output latch, the primary input is used and thus, the performance of the forward read data path is not affected. When used in scan mode, the secondary input is used and although the data path of the secondary input may not have a high performance, this is OK as the performance during scan is not important.

In some embodiments, said memory further comprises: an input multiplexer for receiving said scan input and a data input, said input multiplexer selecting said scan input in response to a scan enable signal being asserted and selecting said data input in response to said scan enable signal not being asserted; an input latch for receiving data from said input multiplexer, an output of said input latch being connected to said secondary input of said latch circuit and to data storage array; said memory being configured in response to said scan enable signal to disable said data storage array.

In addition to the output latch, the memory may have an input latch. These latches can be combined in the scan mode to form a flip-flop for inputting and outputting the scan data.

When the input latch and the latch circuit are used as a flip-flop for scan data, then they should be clocked by synchronised clock signals in order for them to operate correctly. Thus, the select signal of the multiplexer should be synchronised with the clock signal clocking the input latch.

A third aspect of the present invention provides a method of retaining and transmitting an input data value within a latch circuit comprising the steps of: in response to no assertion of a secondary mode enable signal: receiving a data value at a primary input; selecting a multiplexer input such that a data transmitting device is connected to a further device to form a feedback loop; and in response to no assertion of an activating signal: forming a data transmission path comprising said transmitting device for transmitting said data value from said primary input to said output; in response to receiving said asserted activating signal: retaining said data value within said feedback loop, said feedback loop comprising said transmitting device and a further device, said further device being configured to turn on in response to assertion of said activating signal and to turn off in response to no assertion of said activating signal, said feedback loop not retaining data when said further device is turned off; and in response to assertion of said secondary mode enable signal: receiving a data value at a secondary input: selecting said multiplexer input such that said secondary input is connected to said further device to form a secondary data transmission path from said secondary input through said further device and said transmitting device to said output.

A fourth aspect of the present invention provides a means for retaining and transmitting an input data value, said means comprising: a primary input means for receiving a data value; an output means for outputting said data value; a data transmission path comprising a transmitting means for transmitting said data value from said primary input means to said output means; a feedback loop means for retaining said data value, said feedback loop means comprising said transmitting means and a further means, said further means being configured to turn on in response to assertion of an activating signal and to turn off in response to no assertion of said activating signal, said feedback loop means not retaining data when said further means is turned off; said feedback loop means further comprising a multiplexing means for selecting one of a plurality of inputs, said multiplexing means being configured to connect either said data transmitting means to said further means and form said feedback loop means or to connect a secondary input means to said further means and form a secondary data transmission path from said secondary input means through said further means and said transmitting means to said output means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1A:
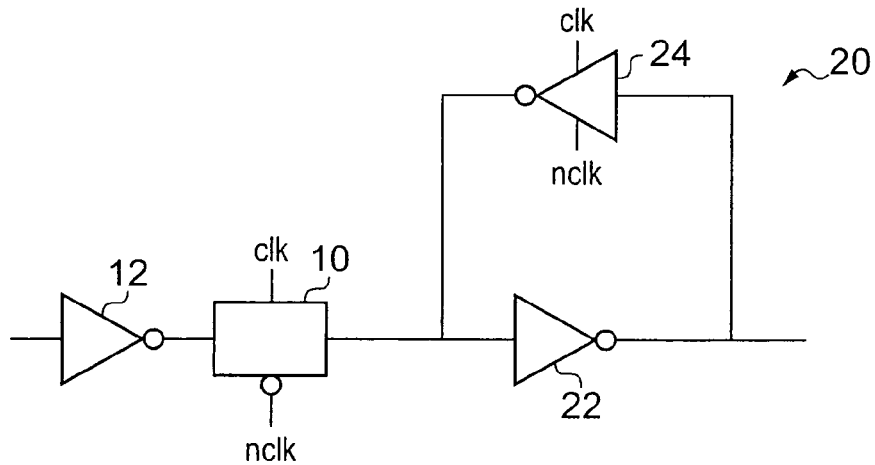
FIG. 1a shows a latch circuit according to the prior art.
Figure 1B:
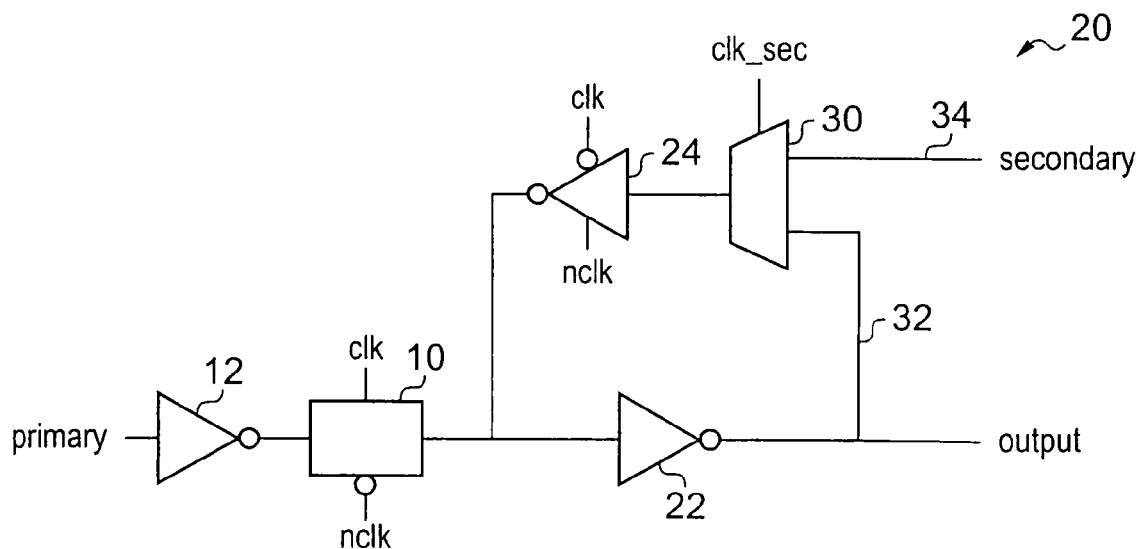
FIG. 1b shows a latch circuit according to an embodiment of the present invention.

FIG. 1b shows a latch having an input inverter 12, a transmission gate 10 and a feedback loop 20. Feedback loop 20 has an inverter 22 on the forward data path of the latch and a tristate inverter 24 that is not on the forward data path. There is also a multiplexer 30 arranged in the feedback loop that is not on the forward data path. The multiplexer 30 has two inputs 32, 34 that it can select between using a select signal CLKsec. One of the inputs 32 is from inverter 22 and the other 34 is the secondary input to the latch.

In functional mode, clock signal CLK is operational such that transmission gate 10 and tristate inverter 24 clock in synchronisation with each other. In this mode the select input CLKsec of multiplexer 30 is set to a constant value that causes the multiplexer 30 to select input 32. Thus, the clock signal CLK in one state causes the transmission gate 10 to open and tristate inverter 24 to turn off such that data passes through from the primary input to the output via inverter 12, transmission gate 10 and inverter 22. When the clock signal changes state, transmission gate 10 closes and tristate inverter 24 turns on so that feedback loop 20 retains the value that was input and this is held at the output. During functional mode, multiplexer 30 continuously selects input 32, and thus, the presence or otherwise of the feedback loop is dependent solely on whether or not tristate inverter 24 is switched on.

When secondary input mode is selected then the select signal CLKsec input to multiplexer 30 switches between a state where the secondary input 34 is selected and a state where input 32 is selected. During this period, the clock signal clk is not clocked but has a constant value such that tristate inverter 24 is permanently on. Thus, whether or not the feedback loop is connected and operates as a feedback loop is now controlled by multiplexer 30 and in effect by the clocked select signal CLKsec that controls multiplexer 30. When the select signal selects the secondary input, then the feedback loop is not connected as a feedback loop and data input from the secondary input passes via tristate inverter 24 to inverter 22 and then on to the output. When the select signal changes state then the feedback loop is connected again and the data previously input is retained within the feedback loop and at the output. When the clock select signal switches again, then the secondary input is selected once more and the value there is then transmitted to the output. Thus, input values are input and retained in response to the CLKsec signal. If this signal is a clocked signal then input values are clocked into the latch.

Figure 2:
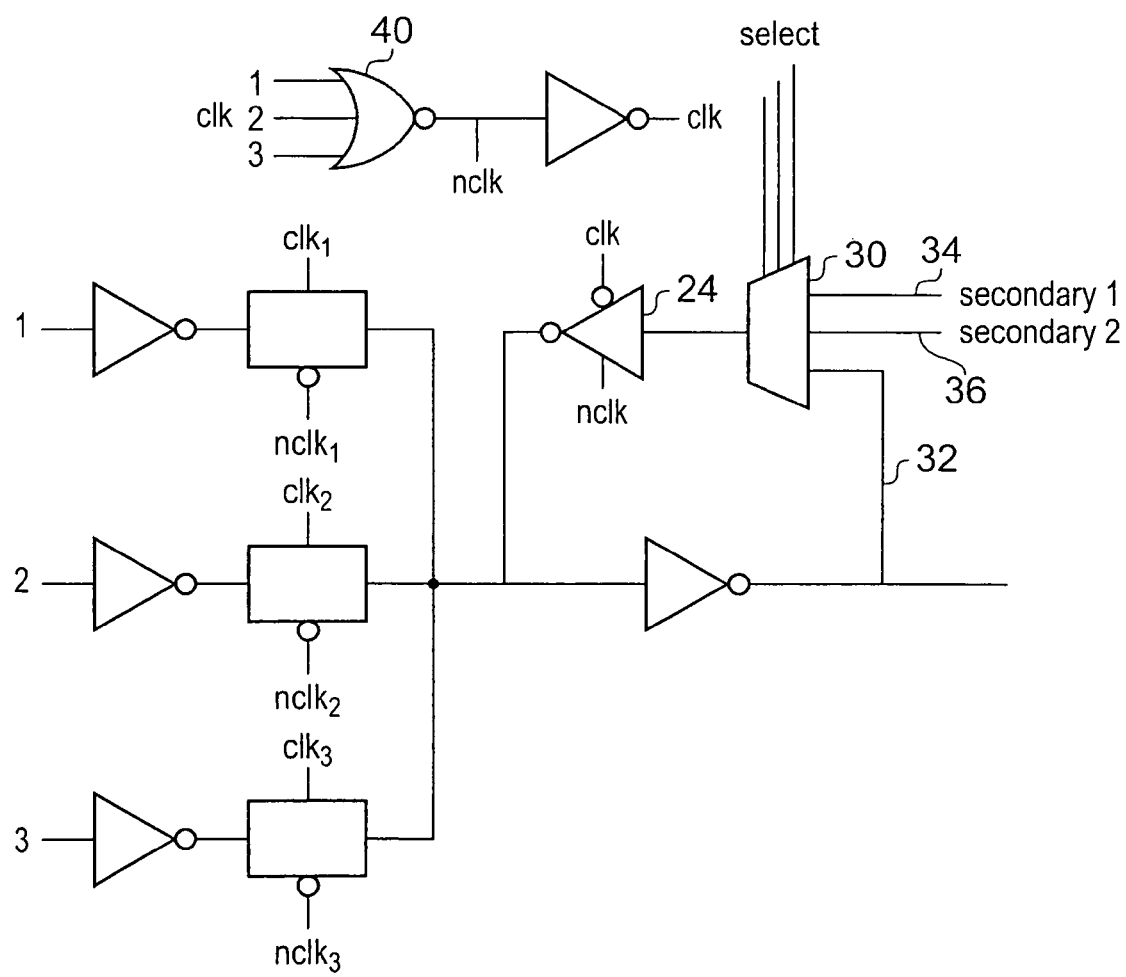
FIG. 2 shows a latch circuit with multiple primary and multiple secondary inputs according to an embodiment of the prior art.

FIG. 2 shows a latch according to an alternative embodiment of the present invention. This latch has multiple primary inputs 1, 2 and 3 and multiple secondary inputs 34 and 36. As can be seen multiple secondary inputs can be provided by providing a multiplexer with additional inputs and a suitable select signal, while multiple primary inputs can be provided with multiple transmission gates, clocked by different clock signals.

The select signal to multiplexer 30 has three possible values each value selecting one of the three inputs. One of the input values simply selects input 32 to form a feedback loop and this occurs in functional mode. The other two possible inputs are intermittent input signals that switch between a value that selects either secondary1 input 34 or secondary2 input 36 and a value that selects the feedback loop input 32, such that data is input at either of the selected secondary inputs and is then retained by the feedback loop.

There are three primary inputs shown in this embodiment and these are all clocked by independent clocks. Tristate inverter 24 is clocked by a clock signal that is output by exclusive OR gate 40, that receives the three clock signals clocking the three input transmission gates clk1, clk2 and clk 3 such that if any of clk 1, 2 or 3 is asserted then the clock to this tristate inverter is asserted and it is turned off. In this way the tristate inverter is synchronised with whichever input is operating, such that it is off, whenever any of the three transmission gates are open, and it is on, when the three transmission gates are closed. The clock signals for these inputs are controlled such that only one of them is asserted to render their respective transmission gate transparent at any one time. This can be done by logic to ensure that only one clock signal is not asserted at any one time, or there can be a priority circuit that gives priority to the clocks such that if more than one of the three clock signals is asserted at any one time, the lower priority clock(s) has its asserted signal masked. During secondary input mode, these clocks are not clocked and tristate inverter 24 is permanently on.

Figure 3:
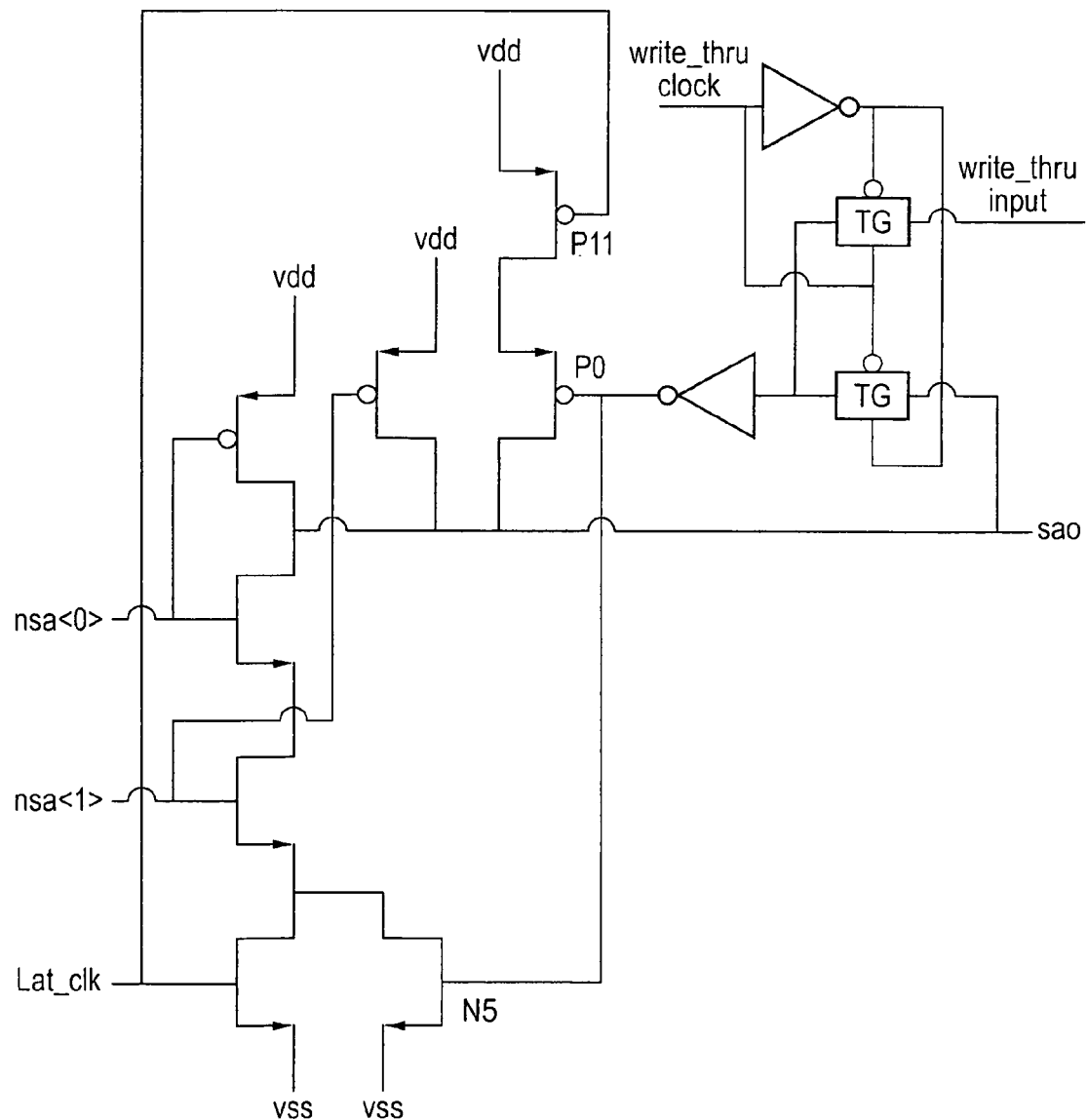
FIG. 3 shows in transistor form a set dominant latch according to an embodiment of the present invention.

FIG. 3 shows a set dominant latch that is used as an output latch in a memory device and can be used to select either scan or a data input path and can operate in either a scan capture, a scan shift, a write through, or a data mode. When the set dominant latch is in normal read mode, the input write through clock is low and the transmission gate multiplexer allows data to be fed back from the output SAO back into the latch. If the latch clock lat_CLK rises, then the read data from either input nsa<0> or nsa<1> propagates through the latch to output SAO. This then drives the output of the latch using an inverter not shown in the diagram. This is usual behaviour for a set dominant latch.

During a write through operation, lat_CLK is low and write through clock is high, the multiplexer then connects the write through input to the feedback devices P0, P11 and N5 in the set dominant latch and this data is propagated through to the output SAO. At the end of the of the write cycle, write through clock falls and the data is held on the output as the latch is now returned to the re-circulating latched state.

In this embodiment there are two inputs as the latch receives data from two sense amplifiers. The inputs are pre-charged inputs receiving data from the sense amplifiers which have been designed to have pre-charged outputs. This means that the input is always high when the transmission gate is closed and thus, one of the clocks usually required for a transmission gate can be dispensed with. Pre-charged inputs have some advantages. Any transition in a pre-charged system will be from high to low and thus, the system can be optimised to improve the performance of this transition.

Figure 4A:
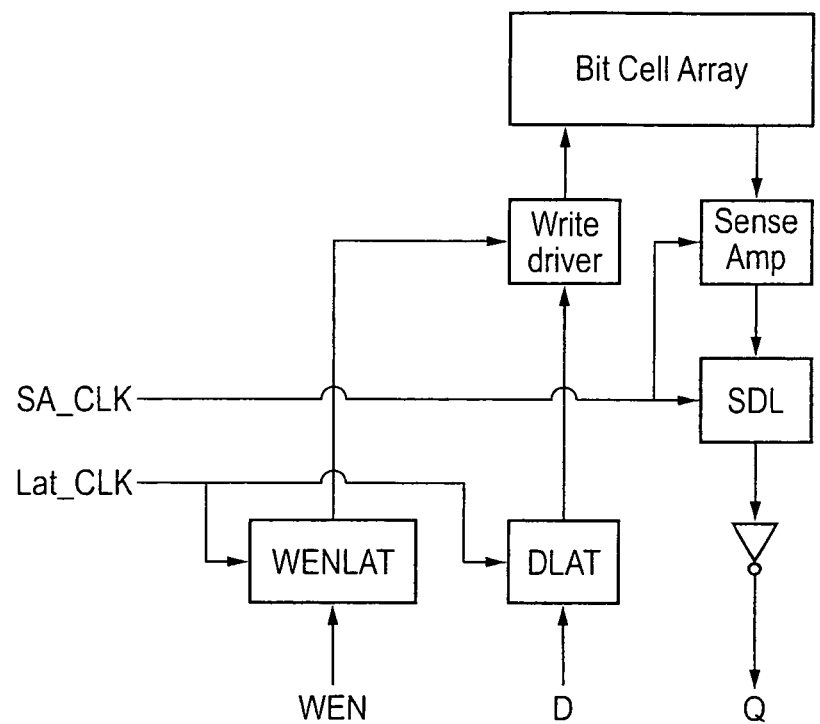
FIG. 4a shows in block form a portion of a memory circuit according to the prior art.
Figure 4B:
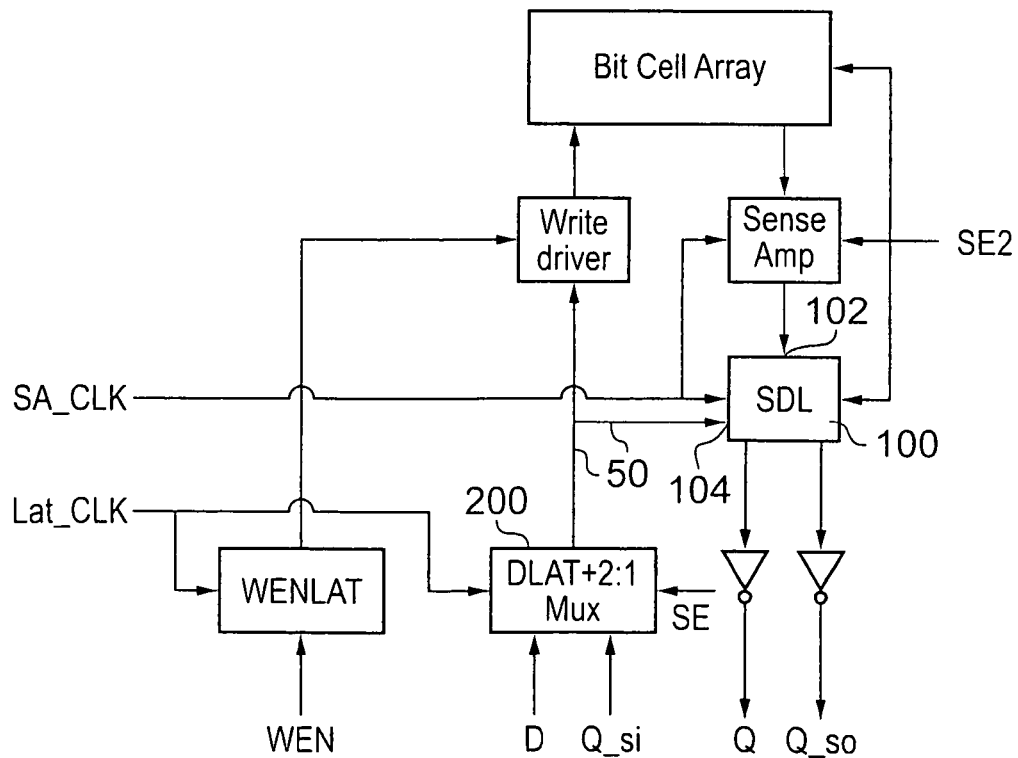
FIG. 4b shows in block form a portion of a memory circuit according to an embodiment of the present invention.

FIG. 4a shows a bit slice through a conventional memory and FIG. 4b shows a bit cell slice of a memory according to an embodiment of the present invention.

In functional operation both of these illustrated memories function in the same way. During a write cycle the write data D is input through an input latch DLAT and the write data D is merged with the write mask in the write driver which then drives the data into the bit cell array. During the read cycle the write driver is disabled and the bit cell array drives the inputs of the sense amplifier which senses the read value when clock value SA_CLK is fired. This value is then stored in the SDL set dominate output latch 100 which is arranged on the output of the sense amplifier and the value is then buffered and driven out on the output pin Q.

In order to be able to support scan the device of FIG. 4A is amended as is shown in FIG. 4b. Firstly a two to one multiplexer is added to the input latch DLAT to form a combined multiplexer latch 200. An additional control pin has been added SE which enables the scan and causes the scan input to be selected at latch 200 and the output to be sent via scan path 50 to the Set dominant latch SDL 100. This SDL latch 100 is a latch according to an embodiment of the present invention, such as that shown in FIG. 1b, and comprises a primary input 102 for receiving data output from the bit cell array and a secondary input 104 for receiving scan or test data from input multiplexer/latch DLAT 200.

The circuit comprises an additional control signal SE2 which is added to the SDL latch 100 and causes this to select as its input an input 104 from the scan path 50 rather than an input 102 from the sense amplifier which comprises data output by the bit cell array. This additional input can be used in scan capture mode, and in scan shift cycle mode.

In scan capture mode the scan enable signal is not set and therefore data is input via latch DLAT, however, as data is simply required to be latched through the scan chain and output the further enable SE2 signal is set and this selects data input 104, such that the data follows the scan path 50 is input via input 104 and output via latch SDL and does not pass through the bit cell array. The bit cell array and sense amplifiers are responsive to the SE2 signal to power down as they are not required and this saves power consumption.

In a scan shift cycle, the scan enable signal SE is set and therefore the scan input Q_Si is input to the multiplexer latch DLAT 200. In this case as in scan capture mode the further enable SE2 signal is set which means that the scan data follows the scan path 50 and is output via latch SDL. In this case the scan data also does not pass through the bit cell array. The circuit is arranged so that the bit cell array and the sense amplifiers are responsive to the further enable signal SE2 to be powered down in scan capture and scan shift cycle modes. Thus, in these modes these parts of the circuit are powered down and do not operate. This saves power consumption.

In write through mode the write data is sent to the bit cell array and a location is written but the same data is also passed through to the output of the memory, Q. Conventionally this has been done by firing the sense amp during the write operation, however with the new latch structure of embodiments of the invention the additional input of latch 100 can be used to pass the write data through to the output via path 50 in parallel to writing the data to the bit cell array. Thus, the senseamp amps do not need to be fired. The functionality as seen from the output Q is the same but the power is lower overall as firing the senseamp uses more power than using the new latch input.

Furthermore, as the write through path is integrated into the SDL latch 100 this produces a zero timing penalty for the normal read path. This is shown in more detail in FIG. 6. During writes in write through mode the forward path through the sense amplifier is not used and SA_CLK does not fire and this reduces power consumption.

In normal operation the scan enable SE and further enable SE2 signals are not asserted and thus, the data enters the latch 200 and is sent through to the write driver where it is written to the bit cell array. In a read mode the sense amplifier senses data and sends it to the SDL latch from where it is output.

During capture or scan cycles all activity in the bit cell array is disabled. The write buffer does not write data and the sense amplifier doesn't fire. During capture (or write through) the 2:1 mux latch in DLAT selects the D input. On the rising edge of the system clock, Lat_CLK fires and shuts DLAT. Another clock allows the write data to propagate through the SDL and through to the output Q. This clock is not shown. The timing to output is identical to a write cycle and DLAT and SDL act in the manner of the master slave in a flip flop.

During the scan cycle the 2:1 multiplexer on latch DLAT selects scan input Q_SI. In this case the output Q_SO [I] is connected to Q_SI [I+1]. In other words the scan chain passes the value through these cells and through the master slave combinations of the two latches DLAT and SDL. The timing on Q is the same as during a write cycle with write through. Again the array and sense amplifier are powered down to reduce power.

It should be noted that the system may be set up so that the SE2 signal that selects the path 50 and controls the power down of the sense amplifiers and the storage array is generated in response to a scan capture and scan shift cycle request. In response to a "write through" request, the write through request being generated by a user, the path 50 is selected and the sense amplifiers are not fired and may be powered down, however, the bit cell array retains its power.

In some embodiments, the left hand side and right hand side of the memory have their own scan chains to reduce the length of each scan chain. Each scan chain has its own scan input SI which is connected to the Q_SI input of the MSB in the scan chain and a scan output pin which is a copy of Q of the LSB in the scan chain. The scan input/output pins allow the scan chain to be stitched together with other scan chains which may be present in other memories or in standard cell logic as is required.

Figure 5A:
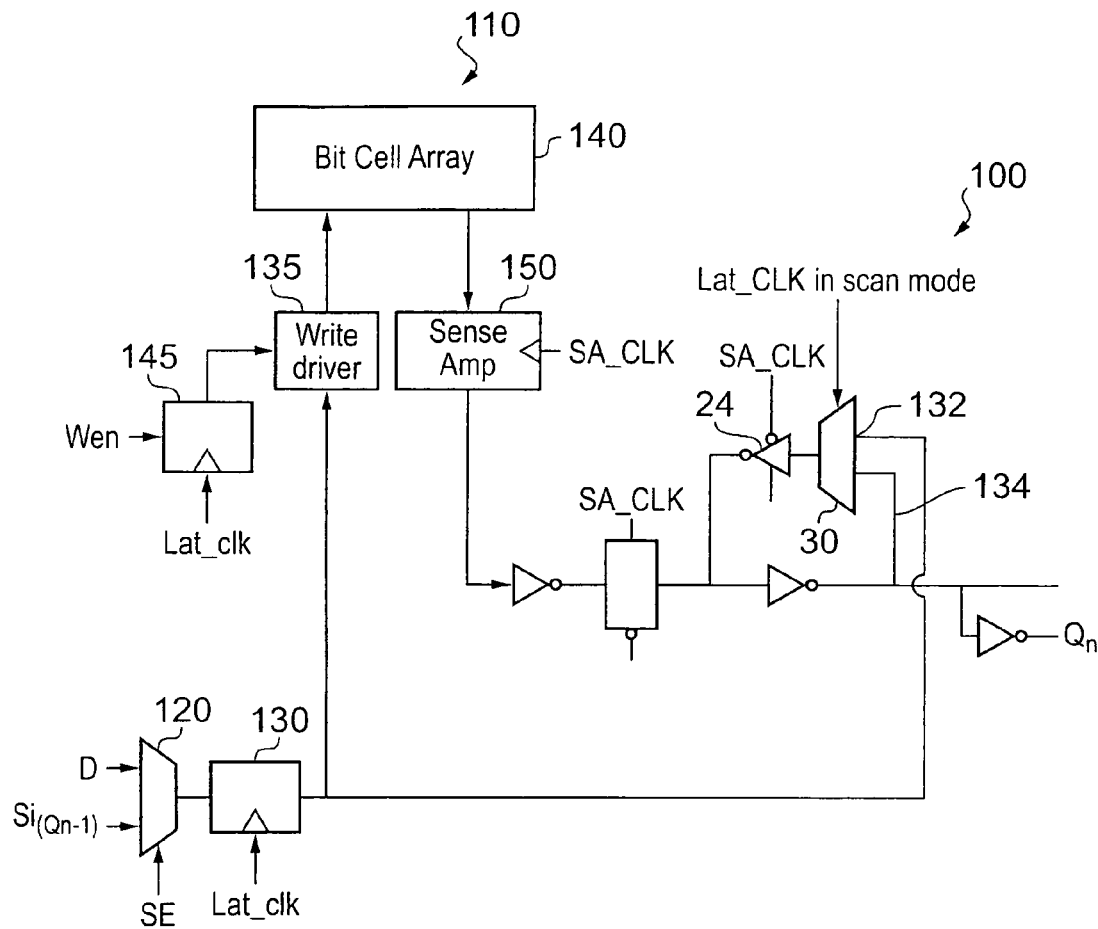
FIG. 5a shows a portion of a memory circuit similar to that of FIG. 4b.

FIG. 5a shows a latch 100 according to an embodiment of the present invention within a memory device 110, that is similar to the memory device of FIG. 4b, but is shown in more detail. There are two inputs to this memory device; data input D and scan input Si. These two inputs are received at multiplexer 120, which selects either the scan input Si in response to a scan enable signal SE, or the data input D. Input latch 130 receives data from multiplexer 120 and when the memory is operating in functional write mode with scan enable not asserted, the data input passes from latch 130 to write driver 135 which in response to a write enable signal received via latch 145 writes the value to the bit cell array 140. In functional read mode, data stored in the storage array 140 is sensed by sense amplifiers 150 and is output to output latch 100. In functional mode the output latch 100 is clocked by SA_clk that also clocks the sense amplifier and the bit cell array. In this mode the multiplexer 132 within latch 100 has a select signal that is not clocked and that controls the multiplexer to constantly select input 134. Thus, output latch 130 acts as a standard latch and latches the received value and outputs it via output Qn. This Figure shows the nth bit slice of memory 110, and thus, the output value is the nth bit Qn of output value Q.

In scan mode, the scan enable signal SE is asserted and input Si is selected by multiplexer 120. This scan data is output by multiplexer 120 to latch 130, from where it is output to the secondary input 132 of output latch 100. In scan mode, the clock SA_clk to storage array 140 is switched off so that the storage array is not functional. Furthermore, there is no write enable signal, thus the output of latch 130 in scan mode is not received at bit cell array 140.

During scan mode SA_clk which clocks the bit cell array 140 and sense amplifier 150 and also clocks the transmission gate of the primary input to latch 100 and the tristate inverter 24 is not clocked so the bit cell array and sense amplifier are not operational, and tristate inverter 24 is permanently conducting. During scan mode the multiplexer 30 has lat_clk as its select signal and thus, selects between inputs 132 and 134 in response to this clock, and thus, this clock clocks the feedback loop and thus, the latch. The input latch 130 is also clocked by lat_clk, thus latch 100 and 130 are synchronised and form a flip-flop in scan mode and scan data passes through this flip-flop and is output at output Qn.

Figure 5B:
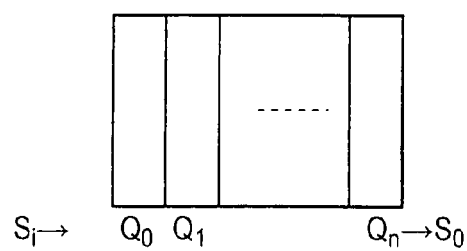
FIG. 5b shows in schematic form how outputs of a memory array can be linked within a scan chain.

The scan data received at scan input Si, could be the output data from a previous stage of the memory. FIG. 5a shows the nth bit slice of the memory and the scan input could be the output from the n−1 bit slice, such that outputs from the different bit slices of the memory can be linked to form a scan chain. FIG. 5b shows very schematically how the outputs can be linked and data can be scanned through each bit slice such that a scan chain is formed.

It should be noted that an additional input is provided to input latch 130 by the conventional use of a multiplexer 120. This multiplexer is on the forward data write path for the memory 110. The write path is not as timing critical as the read path and thus, having a multiplexer on this path is acceptable with regard to performance. Furthermore, it is not suitable to provide the multiplexer within the latch and not on the forward data path as has been done with latch 100, as the input latch 130 needs to be synchronised with the output latch 100 in scan mode to provide a flip flop. This is because in normal operation latch 130 has to be open so D can propagate through to the write driver 135 unhindered. When the clock rises, the latch shuts and the clock drives the data "waiting" at the write driver into the array. If a multiplexer is added to the feedback path of latch 130 then we need to factor SE and the clock into the latch to make it firstly transparent when the D input is selected and secondly closed and the feedback path disabled when the SI input is enabled. This is possible but more complex than simply having a 2:1 multiplexer in front of the latch.

Although the memory 110 has been described with regard to functional and scan mode, it can also operate in scan capture mode, where the scan enable signal SE on multiplexer 120 is not asserted so that the data input D is selected. However, the bit cell array, write driver and sense amplifiers are powered down and SA_clk does not clock, so that the data is not input to the bit cell array 140 but is passed to the secondary input 132 of latch 100. The multiplexer 30 is clocked by lat_clk and the tristate inverter is permanently on, so that the latch 100 is synchronised with input latch 130 and the data is written through the input latch 130 and output latch 100.

Figure 6:
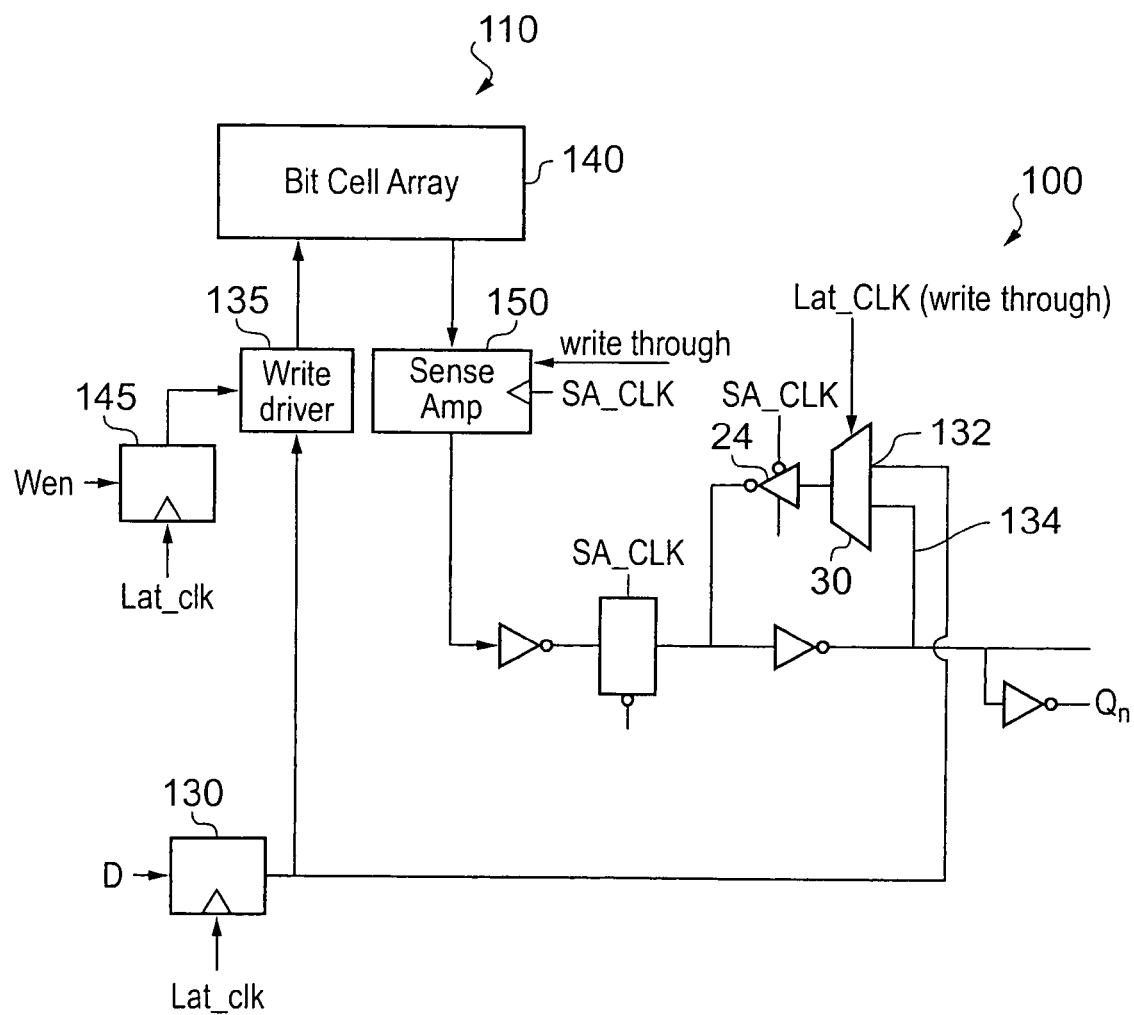
FIG. 6 shows a portion of a memory circuit that uses a latch according to an embodiment of the present invention to operate in write through mode without firing the sense amplifiers.

FIG. 6 shows a circuit similar to that of FIG. 5a, but without a scan input. This embodiment uses the additional input of latch 100 to support write through mode. Thus, although scan is not supported by this circuit, the latch with an additional input provides write through functionality in a power efficient manner without providing any timing penalty on the read path.

In write through mode, the data input via latch 130 is sent to write driver 135 for writing to bit cell array 140 and is also sent to latch 100 where it is received at input 134. Multiplexer 30 of latch 100 is clocked by lat_clk in write through mode and in response to this signal selects input 134. Clock SA_clk is not clocked in this mode and thus, lat_clk controls the clocking of the feedback loop. Thus, the data is received at latch 100 at input 134 and is output at output Qn. Thus, the value does not need to be read from the bit cell array and thus, sense amplifiers 150 do not need to be fired. The write through signal that prompts the sending of the lat_clk signal to multiplexer 30 may also be sent to the sense amplifiers 150, where it is used to power down them down. Although the write through path is shown in FIG. 6 in a device that does not have a scan input, it could also be provided in a device with a scan input such as that disclosed in FIG. 4b and FIG. 5a.

Figure 7:
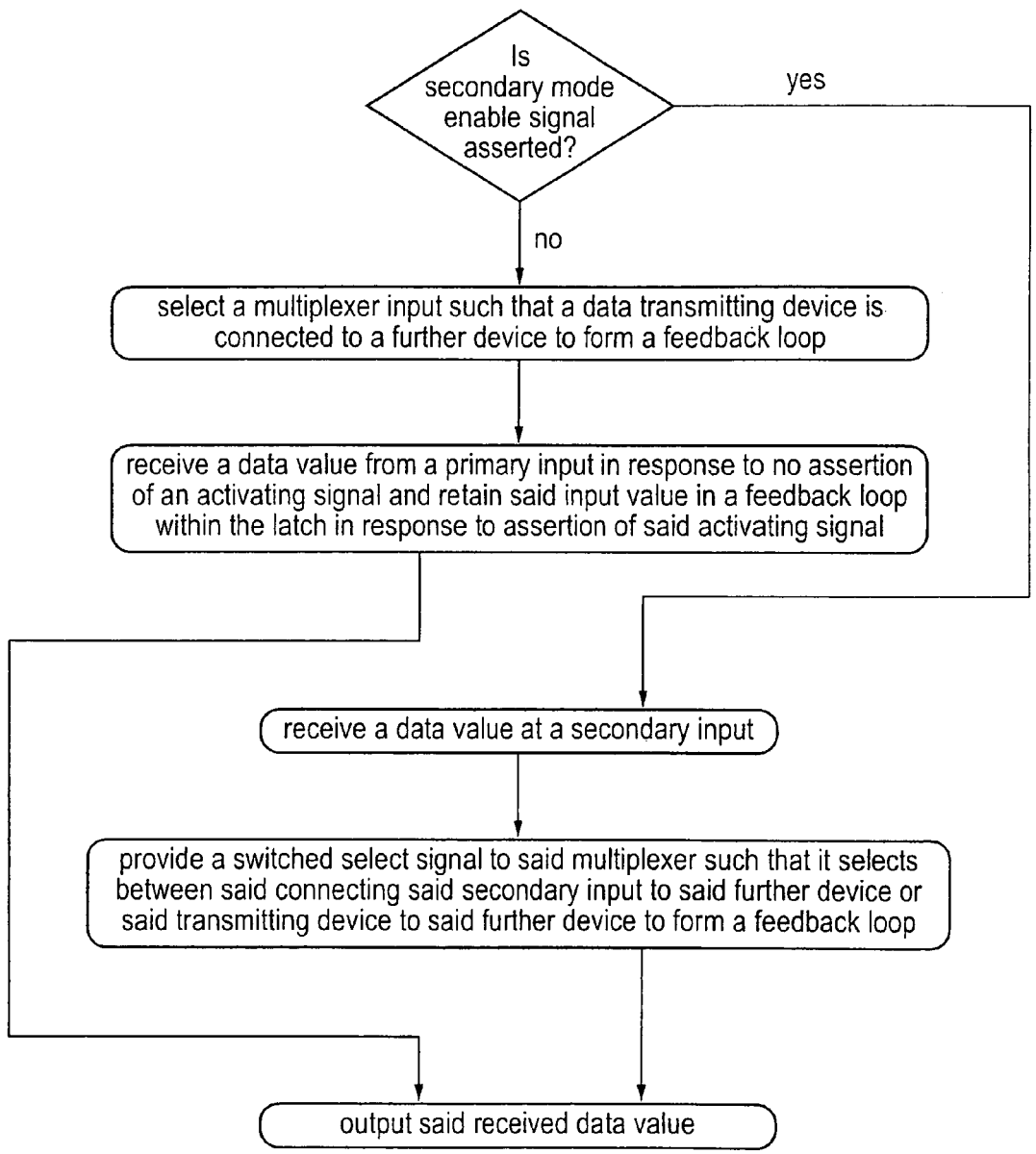
FIG. 7 shows a flow diagram illustrating a method according to an embodiment of the present invention.

FIG. 7 shows a flow diagram illustrating a method of latching data according to an embodiment of the present invention. In this method it is initially determined if the secondary mode enable signal is asserted. If it is, then data is received at the secondary input of the latch. In secondary input mode, the select signal to the multiplexer in the latch is an intermittent signal, so that it intermittently selects different inputs. One selection connects the secondary input to the tristate inverter of the feedback loop which is permanently on in this mode and thus, there is a transmission path from the secondary input through the tristate inverter, and the inverter to the output, while the other selection isolates the secondary input from the latch and connects the feedback loop comprising the tristate inverter and inverter, so that any data input is retained.

Thus, data is latched through the latch from the secondary input in response to the selection signal that controls the multiplexer.

If the secondary input mode signal is not asserted, then the multiplexer in the latch selects the input that connects the feedback loop and not the secondary input. The latch is now controlled by an activating signal, which allows data to be input from a primary input through an isolating device controlled by this signal, and then retains this data by connecting a feedback loop in response to the activating signal. Thus data is latched from the primary input through the latch in a conventional way in response to the activating signal.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

I claim:

1. A latch circuit for retaining and transmitting an input data value, said latch circuit comprising:
    a primary input for receiving a data value;
    an output for outputting said data value;
    a data transmission path comprising a data transmitting device for transmitting said data value from said primary input to said output;
    a further device; and
    a multiplexer, said multiplexer being configured to connect either:
        said data transmitting device to said further device and form a feedback loop for retaining said data value; or
        to connect a secondary input to said further device and form a secondary data transmission path from said secondary input through said further device and transmitting device to said output, wherein said feedback loop comprises said multiplexer, said data transmitting device and said further device, said further device configured to turn on in response to assertion of an activating signal and to turn off in response to no assertion of said activating signal, said feedback loop not retaining said data value when said further device is turned off.

2. A latch circuit according to claim 1, wherein said multiplexer comprises a select signal input and is configured to operate in functional mode and to connect said data transmitting device to said further device to form said feedback loop in response to a select signal received at said select signal input having a first predetermined value and to connect said secondary input to said further device in response to said select signal having a second predetermined value.

3. A latch circuit according to claim 2, wherein said multiplexer is configured to operate in a secondary input mode in response to a secondary input enable signal said latch being configured to turn said further device on in said secondary input mode and said select signal being configured to switch between said first and said second predetermined values in said secondary input mode, such that in response to said second predetermined value said secondary input is connected to said further device and a data value at said secondary input is input, and in response to said first predetermined value said further device is connected to said transmitting device to form said feedback loop and said input data value is retained.

4. A latch circuit according to claim 3, wherein in said secondary input mode said select signal comprises a clock signal.

5. A latch circuit according to claim 1, said latch circuit further comprising an isolating device at said primary input said isolating device being configured to transmit data in response to no assertion of said activating signal and not to transmit data in response to assertion of said activating signal.

6. A latch circuit according to claim 5, wherein said isolating device comprises one of a transmission gate and a tristate inverter.

7. A latch circuit according to claim 1, wherein said activating signal is a clock signal, said further device being configured to turn on in response to a first level of said clock signal and to turn off in response to a second level of said clock signal.

8. A latch circuit according to claim 5, said latch circuit comprising a plurality of primary inputs, each of said plurality of primary inputs comprising a respective isolating device, each of said respective isolating devices receiving independent activating signals, said latch circuit being configured such that only one of said independent activating signals is not asserted at any one time.

9. A latch circuit according to claim 1, said multiplexer being configured to connect said transmitting device to said further device to form said feedback loop or to connect one of a plurality of secondary inputs to said further device to form a secondary data transmission path from said one of said plurality of secondary inputs through said further device and said transmitting device to said output.

10. A latch circuit according to claim 1, wherein said transmitting device is a higher performance device than said further device.

11. A latch circuit according to claim 1, wherein said transmitting device comprises an inverter and said further device comprises a clocked tristate inverter.

12. A latch circuit according to claim 1, wherein said latch circuit comprises a transparent set dominant latch circuit.

13. A memory comprising:
    a data storage array for storing data;
    data access circuitry for providing data access to said memory, said data access circuitry comprising
    a latch circuit according to claim 1,
    said latch circuit being arranged to receive data to be output from said memory at said primary input; and
    said memory comprising a scan input for inputting scan data, said latch circuit being arranged to receives said scan input at said secondary input.

14. A memory according to claim 13, said memory further comprising:
    an input multiplexer for receiving said scan input and a data input, said input multiplexer selecting said scan input in response to a scan enable signal being asserted and selecting said data input in response to said scan enable signal not being asserted;
    an input latch for receiving data from said input multiplexer, an output of said input latch being connected to said secondary input of said latch circuit and to data storage array;
    said memory being configured in response to said scan enable signal to disable said data storage array.

15. A memory according to claim 14, said input latch and said multiplexer of said latch circuit being clocked by a same clock signal.

16. A method of retaining and transmitting an input data value within a latch circuit comprising the steps of:
- in response to no assertion of a secondary mode enable signal:
- receiving a data value at a primary input;
- selecting a multiplexer input such that a data transmitting device is connected to a further device to form a feedback loop; and
- in response to no assertion of an activating signal:
- forming a data transmission path comprising said transmitting device for transmitting said data value from said primary input to said output;
- in response to receiving said asserted activating signal:
- retaining said data value within said feedback loop, said feedback loop comprising said transmitting device and said further device, said further device being configured to turn on in response to assertion of said activating signal and to turn off in response to no assertion of said activating signal, said feedback loop not retaining data when said further device is turned off; and
- in response to assertion of said secondary mode enable signal:
- receiving a data value at a secondary input:
- selecting said multiplexer input such that said secondary input is connected to said further device to form a secondary data transmission path from said secondary input through said further device and said transmitting device to said output.

17. A method according to claim 16, wherein in response to assertion of said secondary mode enable signal, said step of selecting said multiplexer input is performed cyclically, such that said multiplexer switches between connecting said secondary input to said further device so that a data value at said secondary input is input, and connecting said further device and said transmitting device to form said feedback loop such that said input data value is retained within said feedback loop.

18. A method according to claim 16, wherein said primary input comprises an isolating device for selectively isolating said primary input from said latch, and in response to assertion of said activating signal said isolating device isolates said primary input from said latch and in response to no assertion of said activating signal said isolating device connects said primary input to said latch.

19. A means for retaining and transmitting an input data value, said means comprising:
- a primary input means for receiving a data value;
- an output means for outputting said data value;
- a data transmission path comprising a transmitting means for transmitting said data value from said primary input means to said output means;
- a further means for transmitting said data value; and
- a multiplexing means for connecting:
- either said data transmitting means to said further means forming a feedback loop; or
- connecting a secondary input to said further means forming a secondary data transmission path from said secondary input means through said further means and said transmitting means to said output means, wherein said feedback loop comprises said multiplexer means, said transmitting means and said further means, said further means configured to turn on in response to assertion of an activating signal and to turn off in response to no assertion of said activating signal, said feedback loop not retaining said data value when said further means is turned off.

* * * * *